United States Patent
Lei et al.

(10) Patent No.: US 6,784,089 B2
(45) Date of Patent: Aug. 31, 2004

(54) FLAT-TOP BUMPING STRUCTURE AND PREPARATION METHOD

(75) Inventors: Kuolung Lei, San Jose, CA (US); Tony Shen, San Jose, CA (US); Susana Samoranos, S.J., CA (US); Te-Sung Wu, San Jose, CA (US); Tsing-Chow Wang, Cupertino, CA (US)

(73) Assignee: Aptos Corporation, Milpitas, CA (US)

( * ) Notice: Subject to any disclaimer, the term of this patent is extended or adjusted under 35 U.S.C. 154(b) by 0 days.

(21) Appl. No.: 10/342,220

(22) Filed: Jan. 13, 2003

(65) Prior Publication Data

US 2004/0137707 A1 Jul. 15, 2004

(51) Int. Cl.[7] .............................................. H01L 21/44
(52) U.S. Cl. ...................................... 438/613; 438/614
(58) Field of Search .............................. 438/612, 613, 438/614; 257/737, 773, 780

(56) References Cited

U.S. PATENT DOCUMENTS

| | | | | |
|---|---|---|---|---|
| 4,258,382 A | * | 3/1981 | Harris .......................... 257/737 |
| 4,263,606 A | * | 4/1981 | Yorikane ...................... 257/737 |
| 5,136,363 A | * | 8/1992 | Endo et al. ................... 257/781 |
| 5,656,858 A | * | 8/1997 | Kondo et al. ................. 257/737 |
| 5,885,891 A | * | 3/1999 | Miyata et al. ............... 438/612 |
| 5,888,892 A | * | 3/1999 | Yanagida ...................... 438/614 |
| 6,024,274 A | * | 2/2000 | Chang et al. ........... 228/180.22 |
| 6,049,130 A | * | 4/2000 | Hosomi et al. .............. 257/750 |
| 6,420,788 B1 | * | 7/2002 | Chen ............................. 257/777 |

\* cited by examiner

*Primary Examiner*—T. N. Quach
(74) *Attorney, Agent, or Firm*—Tung & Associates (57) ABSTRACT

A method of making an electrical contact bump electrical contact structure on a substrate comprising: providing a substrate having a bond pad, and a passivation layer overlying a portion for the substrate and wherein the passivation layer includes an opening therein exposing a portion of the bond pad, and wherein the passivation layer has a raised portion overlying the bond pad; forming an under bump metallurgy over at least the exposed portion of the bond pad and over at least a portion of the raised portion of the passivation layer overlying the bond pad; forming a sacrificial blanket having an opening therein that in cross-section has an inverted T-shape over the substrate so that the opening in the sacrificial blanket is aligned with the bond pad; and depositing an electrically conductive material into the opening in the sacrificial blanket.

28 Claims, 5 Drawing Sheets

FLAT-TOP BUMPING STRUCTURE AND PREPARATION METHOD

FIELD OF THE INVENTION

This invention relates to bumping structures for making an electrical connection, and more particularly to bumping structures having a flat top and methods of preparing the same.

BACKGROUND OF THE INVENTION

As the number of users of visual interfaces such as notebooks, video and digital cameras, electronic dictionaries, pagers, personal digital assistants, and visual display units are rapidly increasing, smaller and lighter weight products are required. Liquid crystal display technology is one of the promising technologies for meeting the smaller size and lighter weight requirements of future products. Traditional ways of mounting the driver chips to the liquid crystal display panels including the seal and zipper strip connector methods. Another approach is the tape automatic bonding which has the benefit of handling finer pitch and savings in package size. But the tape carrier package is expensive. Another mounting technology called "chip on glass" has emerged as a better and more cost-effective means of mounting driver chips to the liquid crystal display panel with the highest possible packing density.

In the chip on glass technology, one of the more important problems to solve is how to consistently obtain a good connection between the chip anisotropic conductive film and glass substrate. With respect to the bumping process, a flat-top gold bump is one of the best solutions today. However, traditional gold bump processing methods don't always produce a flat-top surface. Unflat-top bump surfaces do not provide good electrical contact.

Figure 1A:
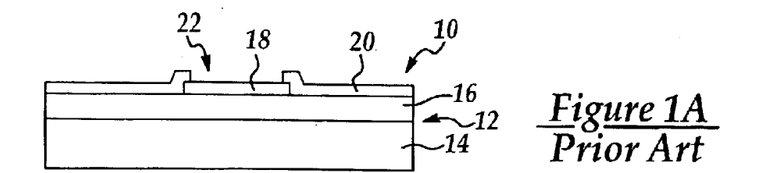
FIG. 1A illustrates a prior art method of providing a semiconductor device including a bond pad.

FIGS. 1A–E illustrate a prior art method of making a semiconductor device having a bump with a flat engagement surface. FIG. 1A illustrates a method of providing a semiconductor device 10 including a substrate portion 12 having a silicon base portion 14 and connectivity portion 16 including a plurality of alternating inter-level dielectric layers and metallization layer is a manner known to those skilled in the art. One of the metallization layers may provide a bond pad 18 on an upper surface of the substrate 12. A passivation layer 20 such as silicon dioxide, silicon nitride, or silicon oxy-nitride may be provided overlying the substrate and includes an opening 22 therein exposing at least a portion of bond pad 18.

Figure 1B:
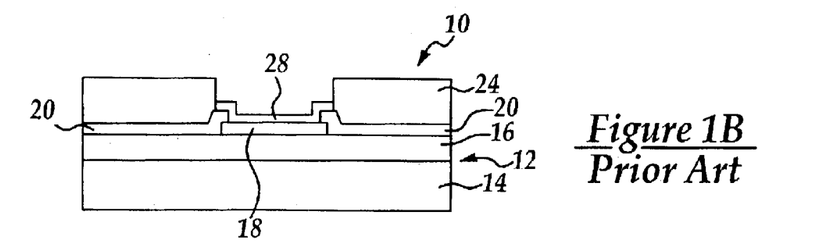
FIG. 1B illustrates a prior art method of forming a first photoresist layer over the semiconductor device of FIG. 1A with an opening therein and depositing an under bump metallurgy through the opening.

FIG. 1B illustrates a method of providing a photoresist layer 24 having an opening 26 therein and aligned with the bond pad 18 and depositing an under bump metallurgy 28 over the bond pad 18 and through the opening 26. Alternatively, it is known to those skilled in the art to deposit the under bump metallurgy over the entire surface of the substrate and thereafter deposit the first passivation layer 24 so that the opening 26 is still aligned with the bond pad 18.

Figure 1C:
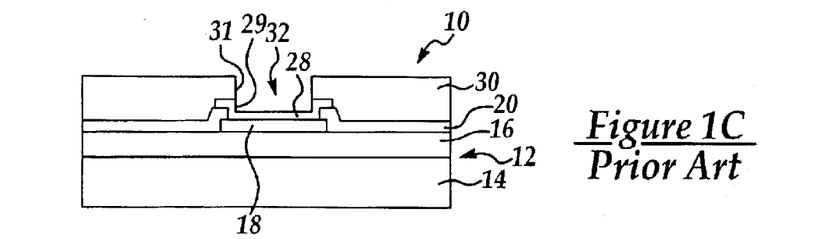
FIG. 1C illustrates a prior art method of removing the first photoresist layer and depositing a second photoresist layer having an opening therein perfectly aligned with a selected portion of the under bump metallurgy.

FIG. 1C illustrates a method of removing the first photoresist layer 24 and depositing a second photoresist layer 30 having an opening 32 therein perfectly aligned with a selected portion of the under bump metallurgy 28 and bond pad 18. When the opening 32 in the second photoresist layer 30 is perfectly aligned with the under bump metallurgy 28, an inner wall 31 of the second photoresist layer 30 defining the opening in 32 is flush with and is in the same plane as an inner wall 29 of the under bump metallurgy 28.

Figure 1D:
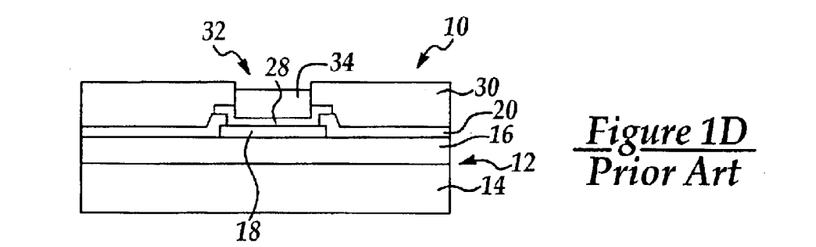
FIG. 1D illustrates a prior art method of electroplating gold through the opening in the second photoresist layer and onto the under bump metallurgy.
Figure 1E:
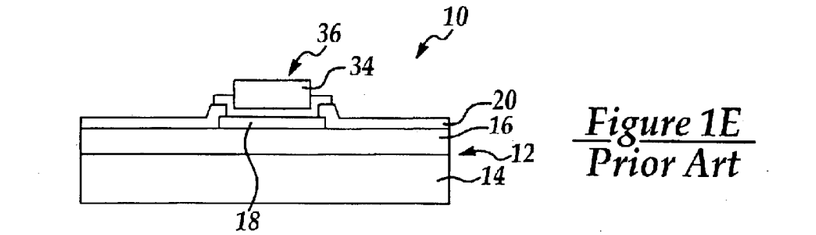
FIG. 1E illustrates a prior art method of removing the second photoresist layer to provide a semiconductor device with a bump having a flat upper surface.

Thereafter, as shown in FIG. 1D, gold 34 is deposited through the opening 32 in the second photoresist layer 30 and onto the under bump metallurgy 28. As shown in FIG. 1E, the second photoresist layer 30 is then removed to produce a bump structure 34 having an upper engagement surface 36 which is flat.

Figure 2A:
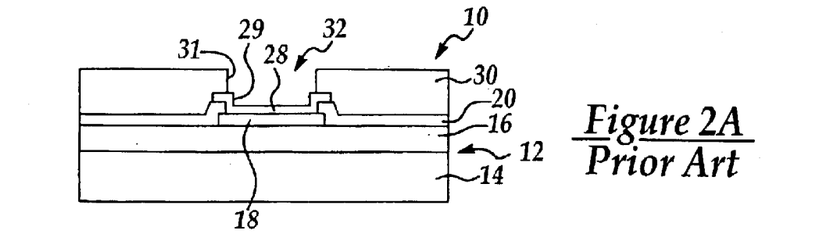
FIG. 2A illustrates a prior art method of forming a second photoresist over a semiconductor device wherein the opening in the photoresist is not perfectly aligned with a selected portion of the under bump metallurgy.
Figure 2B:
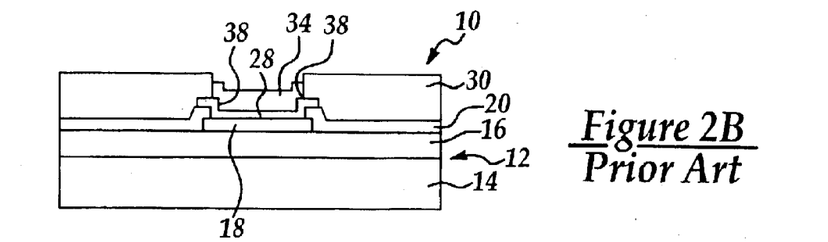
FIG. 2B illustrates a prior art method of electroplating gold into the opening in the second photoresist layer of FIG. 2A producing a bump structure having a top surface that is not flat, and includes the horns.
Figure 2C:
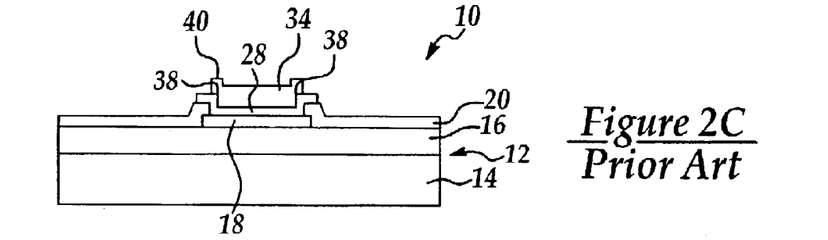
FIG. 2C illustrates a prior art method of removing the second photoresist layer producing a semiconductor device with a bump having an upper surface having horns.

However, as shown in FIG. 2A, the second photoresist layer 30 may be positioned so that the opening 32 is not perfectly aligned with the under bump metallurgy 28 in that the inner wall 31 of the second photoresist layer 30 and the inner wall 29 of the under bump metallurgy 28 are not flush and are not in the same plane. The misalignment can be caused by a number of different manufacturing problems including, for example but not limited to, the opening 32 being too small or too large, or the opening 32 not being aligned or registered properly with the appropriate portions of the underlying under bump metallurgy 28 and bond pad 18. As shown in FIG. 2B, when the gold 34 is electroplated through the opening 32 of the second photoresist layer 30 the gold is deposited in a manner following the topography of the under bump metallurgy 18 including the raised portions 38 that are formed over the portion of the passivation layer 20 covering the bond pad 18. When the second photoresist layer 30 is stripped, a bump structure 34 is provided having an upper surface 36 including raised portions or horns 40. The raised portions or horns 40 of the bump structure 34 do not allow for good electrical contact between the upper surface 36 of the bump structure 34 and another electrical component.

SUMMARY OF THE INVENTION

One embodiment of the invention includes a method of making an electrical contact bump structure on a substrate including providing a substrate having a bond pad, and a passivation layer overlying a portion of the substrate and wherein the passivation layer includes an opening therein exposing a portion of the bond pad, and wherein the passivation layer has a raised portion overlying the bond pad. Forming an under bump metallurgy over at least the exposed portion of the bond pad and over at least a portion of the raised portion of the passivation layer overlying the bond pad. Forming a sacrificial blanket having an opening therein that in cross-section has an inverted T-shape over the substrate so that the opening in the sacrificial blanket is aligned with the bond pad. Depositing an electrically conductive material into the opening in the sacrificial blanket so that the electrically conductive material overlies at least a portion of the under bump metallurgy including a portion of the under bump metallurgy overlying the raised portion of the passivation layer and so that a bump structure is formed having a flat-top engagement surface that is free of any raised portion.

Another embodiment of the invention further includes removing the sacrificial blanket.

Another embodiment of the invention further includes etching back any excess portion of the under bump metallurgy using the bump structure as a mask.

In another embodiment of the invention the forming of the sacrificial blanket includes forming a first photoresist layer and forming an opening in the first photoresist layer, forming a second photoresist layer over the first photoresist layer and forming an opening in the second photoresist layer aligned with the opening in the first photoresist layer so that the opening in the first photoresist layer is larger than the opening in the second photoresist layer and so that the opening in the first photoresist layer and the opening in the second photoresist layer together form an opening through the first photoresist layer and second photoresist layer that in cross-section has an inverted T-shape.

In another embodiment of the invention the forming of the sacrificial blanket having an opening therein that in cross-section has an inverted T-shape and over the substrate so that the opening in the sacrificial layer is aligned with the bond pad includes forming a first photoresist layer over the substrate, exposing a portion of the first photoresist layer to ultraviolet light, and forming a second photoresist layer over the first photoresist layer and exposing a portion of the second photoresist layer to ultraviolet light so that the exposed portion of the second photoresist layer smaller than the exposed portion of the first photoresist layer, and removing the exposed portions of the first photoresist layer and the second photoresist layer to provide an opening through the first photoresist layer and the second photoresist layer that in cross-section has an inverted T-shape.

In another embodiment of the invention the forming of the sacrificial layer having an opening therein that in cross-section has an inverted T-shape over the substrate so that the opening in the sacrificial blanket is aligned with the bond pad includes forming a first photoresist layer over the substrate and exposing the first photoresist layer to ultraviolet light without a mask, and forming a second photoresist layer over the first photoresist layer and selectively exposing a portion of the second photoresist layer to ultraviolet light, and removing the exposed portion of the second photoresist layer and removing the exposed portion of the first photoresist layer, and where the removed portions of the first photoresist layer is smaller than the removed portion the first photoresist layers so that an opening is provided through the second photoresist layer and the first photoresist layer that in cross-section has an inverted T-shape.

Another embodiment of the invention includes the forming of the sacrificial blanket having an opening therein that in cross-section has an inverted T-shape over the substrate so that the opening in the sacrificial blanket is aligned with the bond pad includes forming a non-photosensitive layer over the substrate, and forming a photoresist layer over the non-photosensitive layer, exposing a portion of the photoresist layer to ultraviolet light, and developing the photoresist layer and removing a portion of the photoresist layer and removing a portion of a non-photosensitive layer so that the portion removed from the photoresist layer is smaller than portion removed from the non-photosensitive layer and so that an opening is formed through the photoresist layer and the non-photosensitive layer that in cross-section has an inverted T-shape.

In another embodiment of the invention the non-photosensitive layer comprises a polyimide.

In another embodiment of the invention the openings in the photoresist layer and the non-photosensitive layer are formed by etching so as to undercut the non-photosensitive layer.

In another embodiment of the invention the depositing of the electrically conductive material through the sacrificial blanket comprises electroplating.

In another embodiment of the invention the electrically conductive material deposited into the opening through the sacrificial blanket comprises gold.

In another embodiment of the invention the depositing of the gold into the opening through the sacrificial blanket comprises electroplating.

In another embodiment of the invention the substrate comprises a semiconductor wafer.

In another embodiment of the invention the substrate is flexible.

In another embodiment of the invention the substrate is rigid.

In another embodiment of the invention the substrate comprises a ceramic material.

In another embodiment of the invention the substrate comprises an organic material.

In another embodiment of the invention the substrate comprises a composite material.

Another embodiment of the invention includes a method of making an electric contact bump structure on a substrate including providing a substrate having a bond pad, and a passivation layer overlying a portion the substrate and wherein the passivation layer includes an opening therein exposing a portion of the bond pad, and wherein the passivation layer has a raised portion overlying the bond pad, and an under bump metallurgy over at least exposed portion of the bond pad and over at least a portion of the raised portion of the passivation layer overlying the bond pad. Forming a sacrificial layer blanket having an opening therein that in cross-section has an inverted T-shape over the substrate so that the opening in the sacrificial blanket is aligned with the bond pad. Depositing an electrically conductive material into the opening in the sacrificial blanket so that the electrically conductive material overlies at least a portion of the under bump metallurgy including the portion of the under bump metallurgy overlying the raised portion of the passivation layer and wherein the bump structure is formed having a flat-top engagement surface that is free of any raised portion.

Another embodiment of the invention includes a method of making an electrical contact bump structure on a substrate including providing a substrate having a bond pad, and a passivation layer overlying a portion of the substrate and wherein the passivation layer includes an opening therein exposing a portion of the bond pad, and wherein the passivation layer has a raised portion overlying the bond pad. Forming a sacrificial blanket having an opening therethrough that in cross-section has an inverted T-shape over the substrate so that the opening through the sacrificial blanket is aligned with the bond pad. Depositing an under bump metallurgy into the opening through the sacrificial blanket. Depositing an electrically conductive material into the opening through the sacrificial blanket so that the electrically conductive material overlies at least a portion of the under bump metallurgy including a portion of the under bump metallurgy overlying the raised portion of the passivation layer and so that a bump structure is formed having a flat-top engagement surface that is free of any raised portion.

Another embodiment of the invention includes a method of providing a substrate having a bond pad, and a passivation layer overlying a portion of the substrate and wherein the passivation layer includes an opening therein exposing a portion of the bond pad, and wherein the passivation layer has a raised portion overlying the bond pad, and an under bump metallurgy over at least the exposed portion of the bond pad and over at least a portion of the raised portion of the passivation layer overlying the bond pad. Forming a first photoresist layer over the substrate including the passivation layer, the under bump metallurgy and the bond pad. Over exposing a portion of the first photoresist layer using a large proximity gap on a mask aligner. Forming a second photoresist layer over and the first photoresist layer, and under exposing a portion the second photoresist layer. Developing the first photoresist layer and second photoresist layer and removing the exposed portions thereof to provide an opening in the first photoresist layer and the second photoresist layer that has in cross-section inverted T-shape.

Another embodiment of the invention includes a method of providing a substrate having a bond pad, and a passivation layer overlying a portion of the substrate and wherein the passivation layer includes an opening therein exposing a portion bond pad, and wherein the passivation layer has a raised portion overlying the bond pad, and an under bump metallurgy over at least the exposed portion of the bond pad and over at least a portion of the raised portion of the passivation layer overlying the bond pad. Forming a first photoresist layer over the substrate, the passivation layer, and the under bump metallurgy. Exposing the first photoresist layer to ultraviolet light without a mask. Forming a second photoresist layer over the first photoresist layer, and selectively exposing a portion of the second photoresist layer to ultraviolet light. Developing the first photoresist layer and second photoresist layer and etching the first photoresist layer and the second photoresist layer to provide an undercut of the first photoresist layer so that an opening is provided through the first photoresist layer and a second photoresist layer that in cross-section has an inverted T-shape.

Another embodiment of the invention includes a method of providing a substrate having a bond pad, and a passivation layer overlying a portion the substrate and wherein the passivation layer includes an opening therein exposing a portion of the bond pad, and wherein the passivation layer has a raised portion overlying the bond pad, and an under bump metallurgy over at least the exposed portion bond pad and over at least a portion of the raised portion of the passivation layer overlying the bond pad. Forming a non-photosensitive layer over the substrate including the passivation layer and the under bump metallurgy. Forming a photoresist layer over the non-photosensitive layer and exposing a portion of the photoresist layer to ultraviolet light. Developing the photoresist layer and etching the photoresist layer and the non-photosensitive layer with an undercut of the non-photosensitive layer to provide an opening in the photoresist layer and the non-photosensitive layer that in cross-section has an inverted T-shape.

In another embodiment of the invention the non-photosensitive layer comprises a polyimide.

Another embodiment of the invention includes a product including a substrate and a bond pad, a bump structure overlying the bond pad for making electrical connection to another component, the bump structure including a body portion and an upper electrical engagement surface positioned furthest from the substrate, and wherein the engagement surface is flat and free of horns, and at least one wing extending outwardly from the body portion and location below the upper electrical engagement surface and closer to the substrate.

In another embodiment of the invention the product includes a substrate including a semiconductor wafer.

In another embodiment of the invention the to bump structure of the product comprises gold.

In another embodiment of the invention the bond pad of the product comprises aluminum.

In another embodiment of the invention the product further includes an under bump metallurgy interposed between the bond pad and the bump structure.

In another embodiment of the invention the product includes an under bump metallurgy including a first layer comprising TiW and a second layer comprising gold.

These and other embodiments of the present invention will become apparent from the following brief description of the drawings, detailed description of the preferred embodiments, and appended claims and drawings.

DETAILED DESCRIPTION OF THE PREFERRED EMBODIMENTS

According to the present invention a flat-top bump structure is produced on a substrate utilizing a sacrificial blanket 60 having an opening 50 therethrough which in cross-section has an inverted T-shape. Exemplary embodiments of such a sacrificial blanket 60 having an opening 50 therethrough which in cross-section has an inverted T-shape are illustrated in FIGS. 3E, 4E and 5D.

Figure 3A:
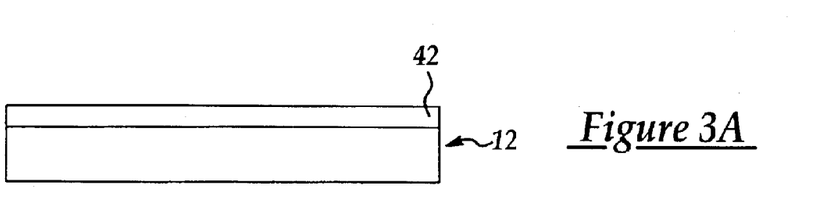
FIG. 3A illustrates a method of providing a semiconductor device and forming a first photoresist layer over the semiconductor device according to the present invention.
Figure 3B:
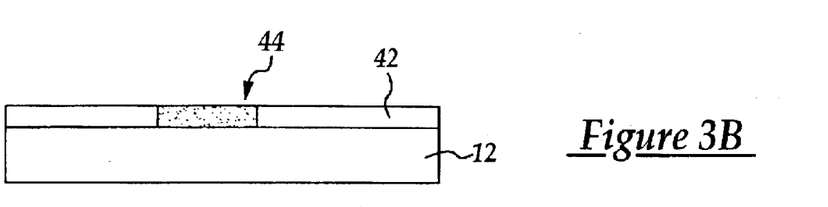
FIG. 3B illustrates a method of selectively developing a portion of the first photoresist layer of FIG. 2A using overexposure and a large proximity gap on an aligner to get a larger exposed portion than the mask is designed to produce under normal operation.
Figure 3C:
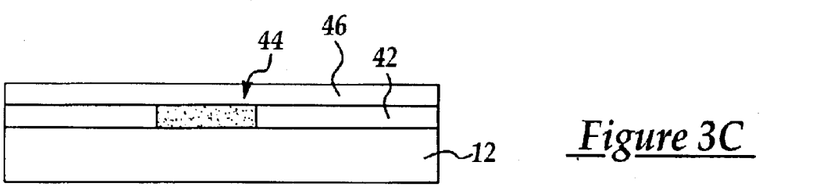
FIG. 3C illustrates a method of forming a second photoresist layer over the first photoresist layer of FIG. 3B.
Figure 3D:
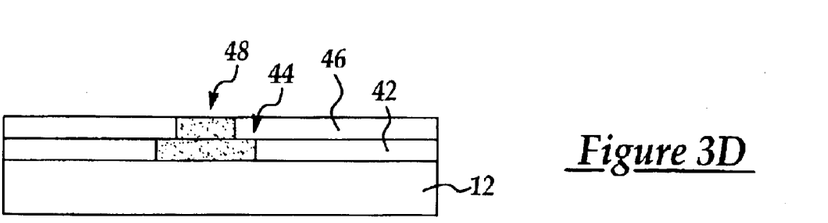
FIG. 3D illustrates a method according to the present invention of selectively developing a portion of the second photoresist layer using underexposure and vacuum contact on the aligner to produce a smaller developed portion of the mask than the mask is designed to produce under normal operation.
Figure 3E:
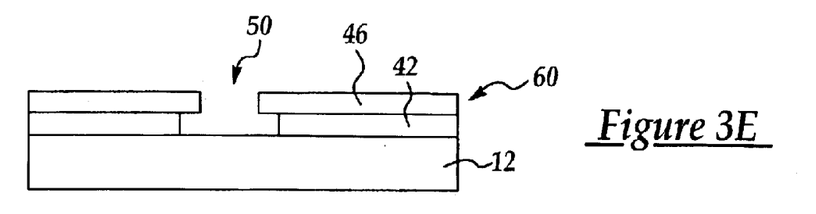
FIG. 3E illustrates a method according to the present invention of selectively removing portions of the first and second photoresist layers to provide a sacrificial blanket having an inverted T-shaped opening therein including a first portion closest to the semiconductor substrate that has a cross-sectional area greater than a second portion furthest from the semiconductor substrate.

FIGS. 3A–E illustrate one embodiment of a method of making a sacrificial blanket 60 having an opening 50 therethrough which has an inverted T-shape. As shown in FIG. 3A, a substrate 12 is provided and a sacrificial layer 42, such as a photoresist layer, is deposited thereon. The substrate 12 may be any of a variety of structures suitable for having a bump structure formed thereon for making electrical connection to another component. For example, but not limited to, the substrate 12 may be a semiconductor device such as a semiconductor wafer having a number of individual integrated circuits defined therein; a ceramic material; an organic material, such as a plastic or thermoset, including, a polyimide; or a composite material, including a fiberglass board. The substrate 12 may be rigid and unbendable, or it may be flexible and bendable such as a flexible polyimide substrate. As shown in FIG. 3B, a selective portion 44 of the first photoresist layer 42 is exposed to ultraviolet light. For example, in one embodiment a 50 percent overexposure and a large proximity gap of approximately 100 $\mu$m on an aligner is used to produce a larger exposed area 44 than would be accomplished using the aligner and mask under normal operating conditions. For purposes of illustration the exposed portions of photoresist layers are illustrated with stippling in the drawings. As shown in FIG. 3C, a second sacrificial layer 46 is deposited over the first photoresist layer 42. As shown in FIG. 3D, a selective portion 48 of the second photoresist layer 46 is exposed. Preferably, in one embodiment underexposure of approximately 10 percent and vacuum contact on the aligner is used to produce a smaller exposed portion 46 than would be accomplished using the aligner and the mask under normal operating conditions. The exposed portion 48 of the second photoresist layer 46 has an area that is smaller than the area of the exposed portion 44 of the first photoresist layer 42. As shown in FIG. 3E, the exposed portions 48, 44 of the second photoresist layer 46 and first photoresist layer 42 respectively are developed and remove to provide an opening 50 in the first photoresist layer 42 and second photoresist layer 46 that in cross-section has an inverted T-shape. As such, FIG. 3E illustrates a method of forming a sacrificial blanket 60 including an opening 50 therethrough that in cross-section has an inverted T-shape on a substrate 12 such as semiconductor wafer. As will be appreciated by those skilled in the art, either positive or negative photoresist layers may be utilized to produce a sacrificial blanket 60 with an inverted T-shape opening therethrough.

Figure 4A:
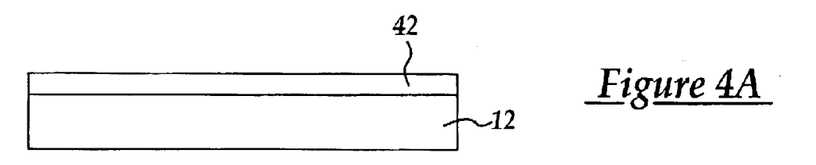
FIG. 4A illustrates a method of forming a first photoresist layer over a semiconductor device according to the present invention.
Figure 4B:
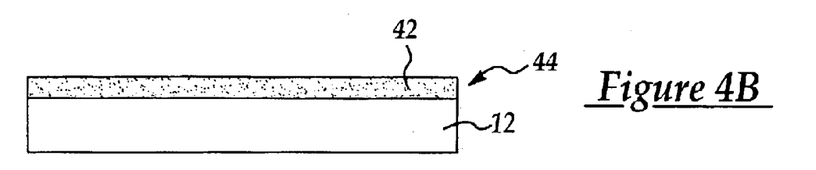
FIG. 4B illustrates a method of exposing the first photoresist layer of FIG. 4A without a mask.
Figure 4C:
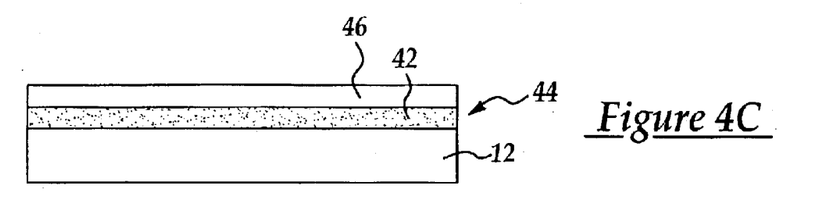
In FIG. 4C illustrates a method of depositing a second photoresist layer over the exposed first photoresist layer of FIG. 4B.
Figure 4D:
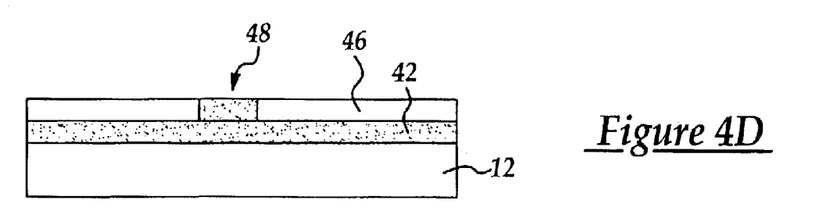
FIG. 4D illustrates a method of selectively exposing a portion of the second photoresist layer using a mask under normal conditions according to the present invention.
Figure 4E:
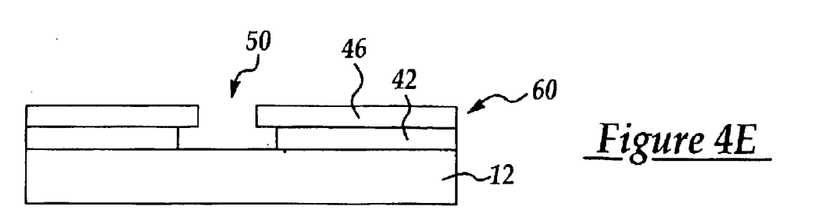
FIG. 4E illustrates a method of removing the exposed portion of the second photoresist layer and using time to get a larger undercut of the first photoresist layer to produce an opening in the first and second photoresist layers, having a cross-sectional configuration of an inverted T-shape according to the present invention.

FIGS. 4A–E illustrate another embodiment of a method of forming a sacrificial blanket 60 including an opening 50 therethrough that in cross-section has an inverted T-shape on a substrate 12. FIG. 4A illustrates a method of forming a first sacrificial layer 42 and such as a photoresist layer over a substrate 12 as shown in FIG. 4B. The entire photoresist layer 42 is exposed to ultraviolet light without a mask. As shown in FIG. 4C, a second sacrificial layer 46 such as a second photoresist layer is deposited over the first photoresist layer 42. As shown in FIG. 4D, a selective portion 48 of the second photoresist layer 46 is exposed to ultraviolet light under normal operating conditions for the aligner and mask and exposure time. As shown in FIG. 4E, the exposed portions are developed and the layers 42, 46 are etched with time control to produce an under cut, for example approximately 10 $\mu$m, of the first photoresist layer 42. This provides an opening 50 through a sacrificial blanket 60 which may in one embodiment include the first photoresist layer 42 and the second photoresist layer 46, or may be a single layer of material. In a single layer embodiment the T-shaped opening may be formed in the layer and the layer applied to the substrate 12 as a decal.

Figure 5A:
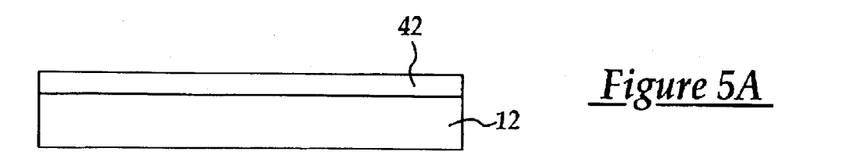
FIG. 5A illustrates a method of forming a non-photosensitive layer, such as a polyimide layer, over a semiconductor device according to the present invention.
Figure 5B:
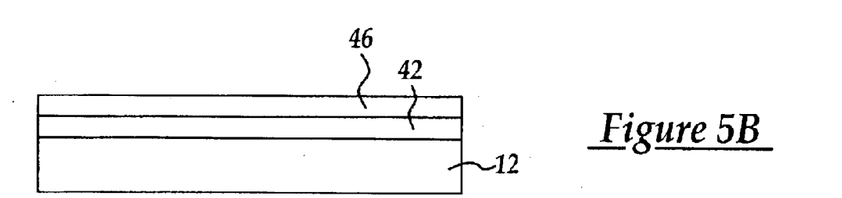
FIG. 5B illustrates a method of forming a photoresist layer over the non-photosensitive layer of FIG. 5A.
Figure 5C:
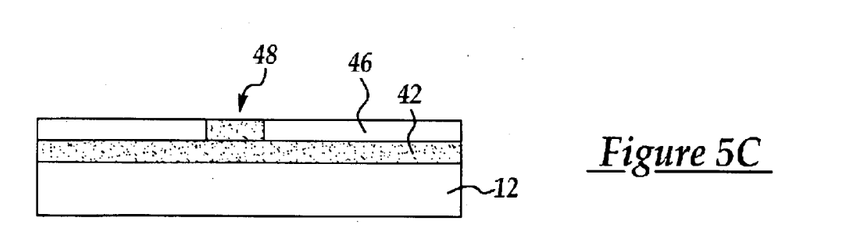
FIG. 5C illustrates a method of exposing a portion of the photoresist layer under normal exposure conditions according to the present invention.
Figure 5D:
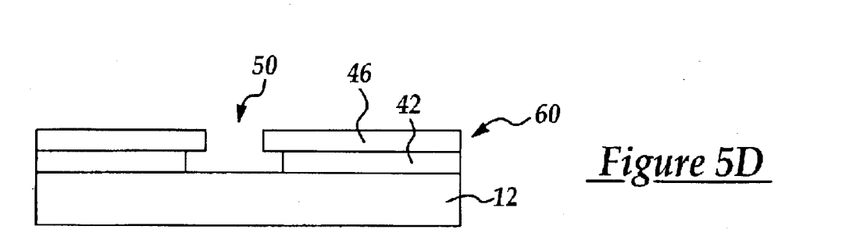
FIG. 5D illustrates a method of removing the exposed portion of the photoresist layer and controlling the undercut of the non-photosensitive layer over time to produce an opening through the non-photosensitive layer and the photoresist layer having a cross-sectional configuration of an inverted T-shape according to the present invention.

As shown in FIG. 5A, a first sacrificial layer 42, for example a non-photosensitive polyimide approximately 10 $\mu$m in thickness, is deposited over a substrate 12. As shown in FIG. 5B, a second sacrificial layer 46, for example a photoresist layer approximately 20 $\mu$m thick, is deposited over the first sacrificial layer 42. As shown in FIG. 5C, a selective portion 48 of the photoresist layer 46 is exposed to ultraviolet light under normal operating conditions of the aligner, mask and exposure time. As shown in FIG. 5D, the photoresist layer is developed and the sacrificial layers 42, 46 are etched with an undercut, for example approximately 10 $\mu$m, of the polyimide layer 42. The result is a sacrificial blanket 60 having an opening 50 therein having an inverted T-shape.

Figure 6A:
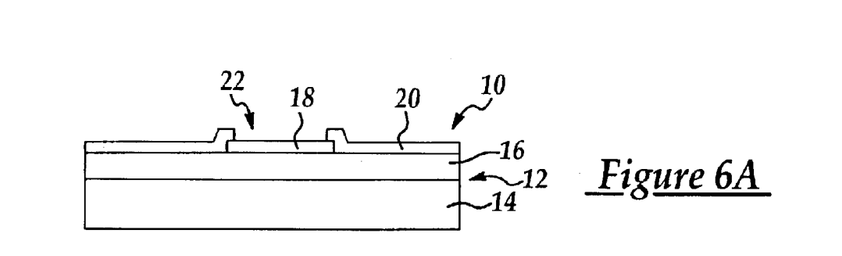
FIG. 6A illustrates a method of providing a semiconductor device having a bond pad according to the present invention.
Figure 6B:
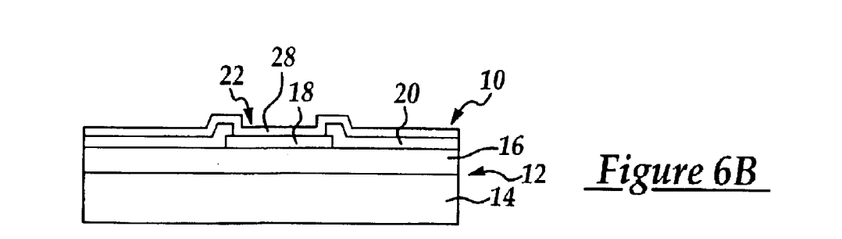
FIG. 6B illustrates a method of forming a first sacrificial layer over the semiconductor device of FIG. 6A, the first sacrificial layer having an opening therein aligned with the bond pad and depositing an under bump metallurgy through the opening in the first sacrificial layer.
Figure 6C:
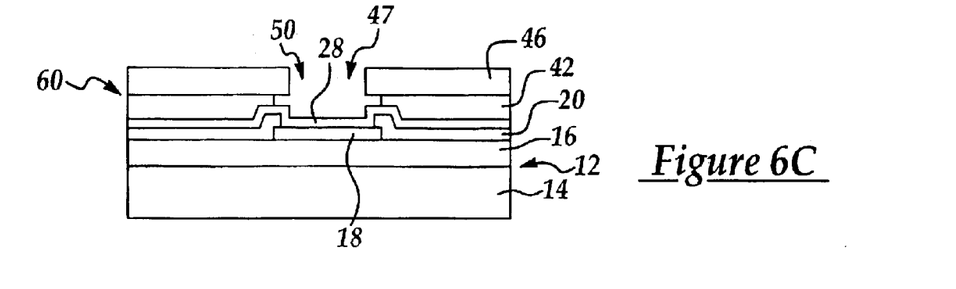
FIG. 6C illustrates a method of forming a second sacrificial layer over the first sacrificial layer of FIG. 6B, the second sacrificial layer having an opening therein aligned with the bond pad, and wherein the opening in the second sacrificial layer has a smaller cross-sectional area than the cross-sectional area of the opening in the first sacrificial layer.
Figure 6D:
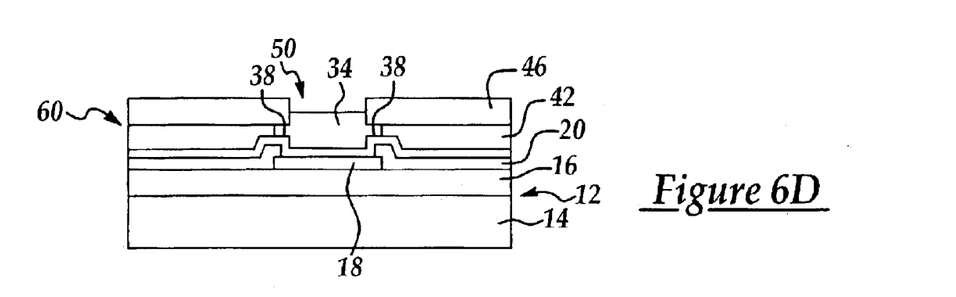
FIG. 6D illustrates a method of depositing an electrically conductive material into the openings in the first and second sacrificial layers and onto the under bump metallurgy according to the present invention.
Figure 6E:
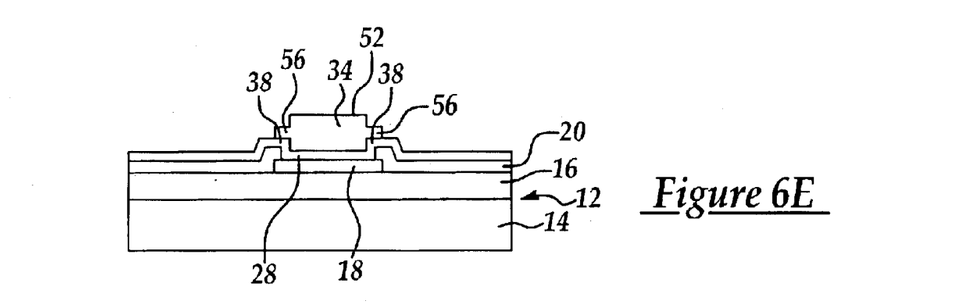
FIG. 6E illustrates a method of removing the first and second sacrificial layers and removing any excess under bump metallurgy according to the present invention.
Figure 6F:
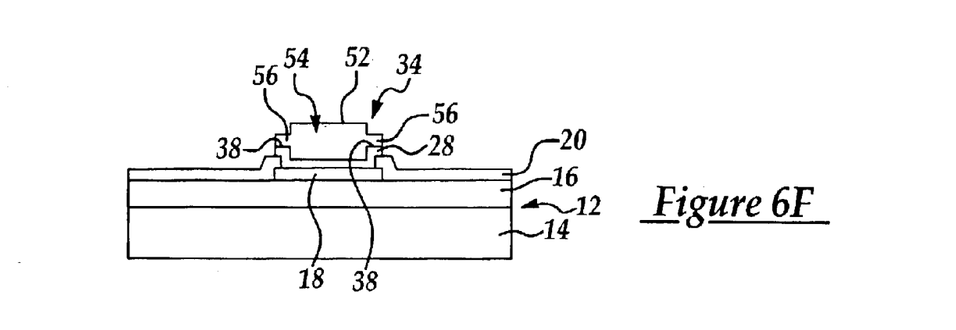
FIG. 6F illustrates a method of removing any excess under bump metallurgy according to the present invention.

According to one embodiment of the invention, a substrate 12 is provided which, for example, may include a silicon based portion 14 having discrete devices formed therein (not shown) and may include a connectivity portion 16 overlying the silicon based portion 14. The connectivity portion 16 may include a plurality of alternating inter-level dielectric layers and metallization layers in a manner known to those skilled in the art. A bond pad 18 is provided, which may be a part of the upper metallization layer, and a passivation layer 20 overlying the substrate 12 including an opening 22 therein exposing at least a portion of the bond pad 18. As shown in FIG. 6B, an electrically conductive material 34 is deposited through the opening 50 in the sacrificial blanket 60. The electrically conductive material 34 may be deposited by any of a variety of methods known to those skilled in the art including electroplating. The electrically conductive material 34 may be any of a variety of materials including, for example to not limited to, gold, silver, Pt, nickel, tin, solder, aluminum and alloys and mixtures thereof. In a preferred embodiment, the electrically conductive material 34 is gold that is electroplated through the opening 50 and onto the under bump metallurgy 28. Because the opening 50 in the sacrificial blanket 60 has in cross section an inverted T-shape, the electroplated material cover is the raised portions 38 of the under bump metallurgy that overlying in portions of the passivation layer 20 that cover the bond pad 18. At some point during the electroplating process, a completely flat surface is provided over the exposed portion of the under bump metallurgy 28. This allows for the production of a bump having a flat upper surface without the possibility of misalignment. Thus, the use of a sacrificial blanket 60 with an opening 50 therein having a an inverted T-shape solves the problem in the prior art caused by misalignment of the photoresist layer opening with the underlying the under bump metallurgy 28 and bond pad 18. As shown in FIG. 6E, the sacrificial blanket 60 is then removed, for example by stripping. Any excess under bump metallurgy is removed by etching using the pump structure 34 and has a mask and a manner known to those skilled in art as shown in FIG. 6F. The resulting bump structure 34 includes and a body portion 54 and an upper electrical contact or engagement portion 52 that is substantially flat and free of any raised portions or horns. The upper electrical contact or engagement portion 52 is positioned furthest from the substrate. At least one wing 56 extends laterally or radially outward from the body portion 54 at a location and below the upper electrical contact or engagement portion 52 and closer to the substrate 12.

As described above, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

A variety of UBM structures are known to those skilled in the art that accomplish the above functions and have one, two, three or more layers depending on whether the bump is gold, copper, aluminum, solder or nickel based. For gold based bumps, known UBM structure include layers of Cr—Cu, Ti—Pd, Ti—W, Ti—Pt or TiW/Au. For copper based bumps, known UBM structures include layers of Cr—Cu, or Al—Ni. For aluminum based bumps, known UBM structure include layers of Ti or Cr. For solder based bumps, known UBM structures include layers of Cr—Cu—Au, Ni—Cu, Ti—Cu, TiW—Cu, Ni—Au, or Al—NiV—Cu. For nickel based bumps, known UBM structure include layers of nickel. The UBM layers may be deposited by electroplating, evaporation, printing, electroless plating, and/or sputtering. It is also known to deposit one or more seed layers over the UBM structure prior to depositing the electrically conductive material (such as solder) that forms the bump. In one embodiment the UBM may be TiW/Au formed at thicknesses of 4000 angstroms and 1000 angstroms respectively.

The foregoing discussion discloses and describes exemplary embodiments of the present invention. More specifically, although some aspects of the present invention are identified herein as preferred or particularly advantageous, it is contemplated that the present invention is not necessarily limited to these preferred aspects of the invention. One skilled in the art will readily recognize from such discussion, and from the accompanying drawings and claims, that various changes, modifications and variations can be made therein without departing from the spirit and scope of the invention as defined in the following claims.

What is claimed is:

1. A method of making an electrical contact bump structure on a substrate comprising:
    providing a substrate having a bond pad, and a passivation layer overlying a portion of the substrate and wherein the passivation layer includes an opening therein exposing a portion of the bond pad, and wherein the passivation layer has a raised portion overlying the bond pad;
    forming an under bump metallurgy at least over the exposed portion of the bond pad and over at least a portion of the raised portion of the passivation layer overlying the bond pad;
    forming a sacrificial blanket having an opening therein that in cross-section has an inverted T-shape over the substrate so that the opening in the sacrificial blanket is aligned with the bond pad;
    depositing an electrically conductive material into the opening in the sacrificial blanket so that the electrically conductive material overlie at least a portion of the under bump metallurgy including the portion of the under bump metallurgy overlying the raised portion of the passivation layer and so that a bump structure is formed having a flat-top engagement surface that is free of any raised portion.

2. A method as set forth in claim 1 further comprising removing the sacrificial blanket.

3. A method as set forth in claim 2 further comprising etching back any excess portion of the under bump metallurgy using the bump structure as a mask.

4. A method as set forth in claim 1 wherein the forming of the sacrificial blanket comprises forming a first photoresist layer and forming an opening in the first photoresist layer;
    forming a second photoresist layer over the first photoresist layer and forming an opening in the second photoresist layer aligned with the opening in the first photoresist layer and so that the opening in the first photoresist layer is larger than the opening in the second photoresist layer so the opening in the first photoresist layer and the opening in the second photoresist layer together form an opening through the first photoresist layer and second photoresist layer that in cross-section has an inverted T-shape.

5. A method as set forth in claim 1 wherein the forming of the sacrificial blanket having an opening therein that in cross-section has an inverted T-shape over the substrate so that the opening in the sacrificial blanket is aligned with the bond pad comprises forming a first photoresist layer over the substrate, exposing a portion of the first photoresist layer to ultraviolet light, and forming a second photoresist layer over the first photoresist layer and exposing a portion of the second photoresist layer to ultraviolet light so that the exposed portion of the second photoresist layer is smaller than the exposed portion of the first photoresist layer, and removing the exposed portions of the first photoresist layer and the second photoresist layer to provide an opening through the first photoresist layer and the second photoresist layer that in cross-section has an inverted T-shape.

6. A method as set forth in claim 1 wherein the method of forming a sacrificial blanket having an opening therein that in cross-section has an inverted T-shape over the substrate so that the opening in the sacrificial blanket is aligned with the bond pad comprises forming a first photoresist layer over the substrate and exposing the first photoresist layer to ultraviolet light without a mask, and forming a second photoresist layer over the first photoresist layer and selectively exposing a portion of the second photoresist layer to ultraviolet light, and removing the exposed portion of the second photoresist layer and removing a portion of the exposed portion of this first photoresist layer, and wherein the exposed portion of the first photoresist layer removed is smaller than the portion removed from the first photoresist layer so that an opening is provided through the second photoresist layer and the first photoresist layer that in cross-section has an inverted T-shape.

7. A method as set forth in claim 1 wherein the forming of the sacrificial blanket having an opening therein that in cross-section has an inverted T-shape over the substrate so that the opening in the sacrificial blanket is aligned with the bond pad comprises forming a non-photosensitive layer over the substrate, and forming a photoresist layer over the non-photosensitive layer, exposing a portion of the photoresist layer to ultraviolet light, and developing the photoresist layer and removing a portion of the photoresist layer and removing a portion the non-photosensitive layer so that the portion removed from the photoresist layer is smaller than the portion removed from the non-photosensitive layer and so that an opening is formed through the photoresist layer and the non-photosensitive layer that in cross-section has an inverted T-shape.

8. A method as set forth in claim 7 wherein the non-photosensitive layer comprises a polyimide.

9. A method as set forth in claim 7 wherein the openings in the photoresist layer and non-photosensitive layer are formed by etching so as to under cut the non-photosensitive layer.

10. A method as set forth in claim 1 wherein the depositing of electrically conductive material through the sacrificial blanket comprises electroplating.

11. A method as set forth in claim 1 wherein the electrically conductive material deposited through the sacrificial blanket comprises gold.

12. A method as set forth in claim 11 wherein the depositing of the electrically conductive material to the sacrificial blanket comprises electroplating.

13. A method as set forth in claim 1 wherein the substrate comprises a semiconductor wafer.

14. A method as set forth in claim 1 wherein the substrate is flexible.

15. A method as set forth in claim 1 the substrate is rigid.

16. A method as set forth in claim 1 wherein the substrate comprises a ceramic material.

17. A method as set forth in claim 1 wherein the substrate comprises an organic material.

18. A method as set forth in claim 1 wherein the substrate comprises a composite material.

19. A method of making an electrical contact bump structure on a substrate comprising:
providing a substrate having a bond pad, and a passivation layer overlying a portion of the substrate and wherein the passivation layer includes an opening therein exposing a portion of the bond pad, and wherein the passivation layer has a raised portion overlying the bond pad, and an under bump metallurgy over at least the exposed portion of the bond pad and over at least a portion of the raised portion of the passivation layer overlying the bond pad;
forming a sacrificial blanket having an opening therein that in cross-section has an inverted T-shape over the substrate so that the opening in the sacrificial blanket is aligned with the bond pad;
depositing an electrically conductive material into the opening in the sacrificial blanket so that the electrically conductive material overlies at least a portion of the under bump metallurgy including the portion of the under bump metallurgy overlying the raised portion of the passivation layer so that a bump structure is formed having a flat-top engagement surface that is free of any raised portion.

20. A method of making an electrical contact bump structure on a substrate comprising:
providing a substrate having a bond pad, and a passivation layer overlying a portion of the substrate and wherein the passivation layer includes an opening therein exposing a portion of the bond pad, and wherein the passivation layer has a raised portion overlying the bond pad;
forming a sacrificial blanket having an opening therethrough that in cross-section has an inverted T-shape over the substrate so that the opening in the sacrificial blanket is aligned with the bond pad;
depositing an under bump metallurgy through the opening in the sacrificial blanket;
depositing an electrically conductive material into the opening in the sacrificial blanket so that the electrically conductive material overlies at least a portion of the under bump metallurgy including the portion of the under bump metallurgy overlying the raised portion of the passivation layer and so that a bump structure is formed having a flat-top engagement surface that is free of any raised portion.

21. A method comprising:
providing a substrate having a bond pad, and a passivation layer overlying a portion of the substrate and wherein the passivation layer includes an opening therein exposing a portion of the bond pad, and wherein the passivation layer has a raised portion overlying the bond pad, and an under bump metallurgy at least over the exposed portion of the bond pad and over at least the portion of the raised portion of the passivation layer overlying the bond pad;
forming a first photoresist layer over the substrate including the passivation layer, the under bump metallurgy and the bond pad;
over exposing a portion of the first photoresist layer using a large proximity gap on a mask aligner;

forming a second photoresist layer over the first photoresist layer, and under exposing a portion of the second photoresist layer;

developing the first photoresist layer and second photoresist layer and removing the exposed portions thereof to provide an opening in the first photoresist layer and the second photoresist layer that has in cross-section an inverted T-shape.

22. A method comprising:

providing a substrate having a bond pad, and a passivation layer overlying a portion of the substrate and wherein the passivation layer includes an opening therein exposing a portion of the bond pad, and wherein the passivation layer has a raised portion overlying the bond pad, and an under bump metallurgy over at least the exposed portion of the bond pad and over at least a portion of the raised portion of the passivation layer overlying the bond pad;

forming a first photoresist layer over the substrate, the passivation layer, and the under bump metallurgy;

exposing the first photoresist layer to ultraviolet light without a mask;

forming a second photoresist layer over the first photoresist layer, and selectively exposing a portion of the second photoresist layer to ultraviolet light;

developing the first photoresist layer and second photoresist layer and etching the first photoresist layer and second photoresist layer to provide an under cut of the first photoresist layer so that an opening is provided through the first photoresist layer and the second photoresist layer that in cross-section has an inverted T-shape.

23. A method comprising:

providing a substrate having a bond pad, and a passivation layer overlying a portion of the substrate and wherein the passivation layer includes an opening therein exposing a portion of the bond pad, and wherein the passivation layer has a raised portion overlying the bond pad, and an under bump metallurgy over at least the exposed portion of the bond pad and over at least a portion of the raised portion of the passivation layer overlying the bond pad;

forming a non-photosensitive layer over the substrate, including the passivation layer and the under bump metallurgy;

forming a photoresist layer over the non-photosensitive layer and exposing a portion of the photoresist layer to ultraviolet light;

developing the photoresist layer and etching the photoresist layer and the non-photosensitive layer with an under cut of the non-photosensitive layer to provide an opening into the photoresist layer and the non-photosensitive layer that in cross-section has an inverted T-shape.

24. A method as set forth in claim 23 wherein the non-photoresist layer comprises a polyimide layer.

25. A method comprising:

providing a substrate having a bond pad thereon:

forming a sacrificial blanket having an opening therethrough, which in cross-section has an inverted T-shape, over at least a portion of the substrate so that the opening is aligned with the bond pad and material can be deposited therethrough.

26. A method as set forth in claim 25 wherein the sacrificial blanket is one layer.

27. A method as se forth in claim 25 wherein the sacrificial blanket comprises at least two layers.

28. A method as set forth in claim 25 further comprising an under bump metallurgy overlying the bond pad.

* * * * *